United States Patent
Song et al.

(10) Patent No.: US 10,553,832 B2
(45) Date of Patent: Feb. 4, 2020

(54) LIGHTING APPARATUS USING ORGANIC LIGHT EMITTING DEVICE AND METHOD OF FABRICATING THEREOF

(71) Applicant: LG Display Co., Ltd., Seoul (KR)

(72) Inventors: Taejoon Song, Paju-si (KR); Namkook Kim, Suwon-si (KR); Shinbok Lee, Seoul (KR); Soonsung Yoo, Goyang-si (KR); Hwankeon Lee, Daejeon (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/704,760

(22) Filed: Sep. 14, 2017

(65) Prior Publication Data

US 2018/0190947 A1   Jul. 5, 2018

(30) Foreign Application Priority Data

Dec. 29, 2016   (KR) .......................... 10-2016-0182831

(51) Int. Cl.
*H01L 51/56* (2006.01)
*H01L 51/00* (2006.01)
(Continued)

(52) U.S. Cl.
CPC .......... *H01L 51/56* (2013.01); *H01L 51/0097* (2013.01); *H01L 51/5012* (2013.01);
(Continued)

(58) Field of Classification Search
None
See application file for complete search history.

(56) References Cited

U.S. PATENT DOCUMENTS

2013/0032841 A1*  2/2013  Jinbo ................... H01L 51/5275
                                                              257/98
2014/0347555 A1* 11/2014  Hirakata ................ G03B 15/03
                                                              348/371
(Continued)

FOREIGN PATENT DOCUMENTS

EP        2 849 534 A1     3/2015
JP       2012-181931 A     9/2012
(Continued)

OTHER PUBLICATIONS

Machine language translation of JP 2012-181931 A.*
(Continued)

*Primary Examiner* — Erik Kielin
(74) *Attorney, Agent, or Firm* — Polsinelli PC

(57) ABSTRACT

According to a lighting apparatus of the present disclosure, an organic light emitting material and a metal layer may be deposited in a state that an edge region of a film being transported is blocked by a shielding member not to form an organic light emitting layer and a second electrode in a region on which a pad is formed. A lighting apparatus may be completed by separating the film as it is cut in a width direction, wherein the organic light emitting layer and the second electrode are exposed to the outside through the cut surface, and an open region from which the organic light emitting layer and the second electrode are removed in parallel to both cut surfaces may be formed within the lighting apparatus spaced apart from the cut surface of the film to disconnect the organic light emitting layer.

14 Claims, 12 Drawing Sheets

(51) Int. Cl.
*H01L 51/50* (2006.01)
*H01L 51/52* (2006.01)

(52) U.S. Cl.
CPC ........ *H01L 51/524* (2013.01); *H01L 51/5212* (2013.01); *H01L 51/5221* (2013.01); *H01L 2251/5338* (2013.01); *H01L 2251/5361* (2013.01); *H01L 2251/566* (2013.01)

(56) References Cited

U.S. PATENT DOCUMENTS

2015/0123095 A1* 5/2015 Washio .............. H01L 51/5243
 257/40
2019/0067626 A1* 2/2019 Shimogawara ........ H05B 33/04

FOREIGN PATENT DOCUMENTS

JP     2014-192050 A     10/2014
WO   WO-2014122938 A1 *  8/2014   ......... H01L 51/5212

OTHER PUBLICATIONS

Machine language translation of WO 2014/122938 A1.*
Search Report dated Jun. 18, 2018 issued in European Patent Application No. 172106957.1, 9 Pages.

* cited by examiner

LIGHTING APPARATUS USING ORGANIC LIGHT EMITTING DEVICE AND METHOD OF FABRICATING THEREOF

CROSS-REFERENCE TO RELATED APPLICATION

This application claims the benefit of Korean Patent Application No. 10-2016-0182831, filed on Dec. 29, 2016, which is hereby incorporated by reference in its entirety for all purposes as if fully set forth herein.

BACKGROUND

Field of the Disclosure

The present disclosure relates to a display device, and more particularly, to a lighting apparatus using an organic light emitting device with a simplified fabrication process, and a fabrication method thereof.

Description of the Background

In recent years, a fluorescent lamp or an incandescent lamp has been mainly used as a lighting apparatus. The incandescent lamp has been selected because it has a good color rendering index. However, the incandescent lamp has a low energy efficiency whereas the fluorescent lamp has a good efficiency, but has a low color rendering index and contains mercury and thus has an environmental problem.

In order to solve such problems of the conventional lighting apparatus in recent years, a light emitting diode (LED) has been proposed as a lighting apparatus. The light emitting diode is composed of an inorganic light emitting material, and has the highest luminous efficiency in a blue wavelength band, but has a lower luminous efficiency as it goes toward a red and a green wavelength band, which is a color having the highest visual sensitivity. Therefore, there is a problem in that the luminous efficiency is reduced when white light with a combination of a red light emitting diode, a green light emitting diode, and a blue light emitting diode is emitted. Furthermore, since the width of each emission peak is narrow when a red light emitting diode, a green light emitting diode, and a blue light emitting diode are used, there is also a problem in that the color rendering property deteriorates.

In order to solve such problems, a lighting apparatus for combining a blue light emitting diode with a yellow colored phosphor instead of combining a red light emitting diode, a green light emitting diode and a blue light emitting diode to output white light has been proposed. The reason why the light emitting diode having such a structure is proposed is that a method of using only a blue light emitting diode having a higher luminous efficiency and using a fluorescent material that receives blue light to emit yellow light for the remaining colors is more efficient than that of using a green light emitting diode having a low luminous efficiency.

However, even in case of a lighting apparatus of combining a blue light emitting diode with a yellow colored phosphor to output white light, the fluorescent material itself that emits yellow light has a poor luminous efficiency, and thus there is a limit in enhancing the luminous efficiency of the lighting apparatus.

SUMMARY

The present disclosure is contrived to solve the aforementioned problem of the present disclosure is to provide a lighting apparatus that can be fabricated by entirely depositing an organic light emitting layer on a substrate without using a mask, and a fabrication method thereof.

In addition, the present disclosure is to provide a lighting apparatus for depositing an organic light emitting material and a metal on a film being transported between rolls in a state that a region formed with a pad is blocked by a roll fabrication apparatus having a shielding member to allow a continuous and rapid process, and a fabrication method thereof.

According to the present disclosure, a lighting apparatus may be fabricated on a film being transported in a roll fabrication apparatus, thereby allowing a continuous and rapid fabrication of a lighting apparatus. In addition, according to the present disclosure, the deposition of an organic light emitting material and a metal may be carried out without using an additional mask, thereby facilitating facilities and simplifying fabrication processes.

To this end, according to the present disclosure, an organic light emitting material and a metal layer may be deposited in a state that an edge region of a film being transported is blocked by a shielding member not to form an organic light emitting layer and a second electrode in a region formed with a pad, thereby opening the pad.

A lighting apparatus may be completed by separating a film as it is cut in a width direction, and at this time, the organic light emitting layer and the second electrode may be exposed to the outside through the cut surface. An open region from which the organic light emitting layer and the second electrode are removed in parallel to both cut surfaces may be formed within the lighting apparatus spaced apart from the cut surface of the film (i.e., substrate). Accordingly, the organic light emitting layer exposed to the outside may be disconnected from the open region, thereby preventing moisture and air infiltrated through the organic light emitting layer from being propagated through the organic light emitting layer into the lighting apparatus through the organic light emitting layer.

A first electrode, an organic light emitting layer, and a second electrode are formed on a lighting portion of the lighting apparatus to form an organic light emitting device, and a first pad is connected to the first electrode and a second pad is connected to the second electrode to apply a voltage thereto. Here, a portion of the organic light emitting layer is laser-etched to form a contact portion, and the second electrode is electrically connected to the second pad through the contact portion.

According to the present disclosure, the process may be carried out on a film transported between rolls by a roll fabrication apparatus, thereby allowing a rapid and continuous fabrication process of a lighting apparatus. In addition, according to the present disclosure, a lighting apparatus may be fabricated without using an additional mask, thereby reducing the cost of facilities and decreasing the installation space of facilities.

In addition, according to the present disclosure, an open region may be formed on an organic light emitting layer exposed through a lateral end surface to disconnect the organic light emitting layer, thereby preventing moisture or air from being infiltrated into the lighting apparatus through the organic light emitting layer.

BRIEF DESCRIPTION OF THE DRAWINGS

The accompanying drawings, which are included to provide a further understanding of the disclosure and are incorporated in and constitute a part of this specification, illustrate aspects of the disclosure and together with the description serve to explain the principles of the disclosure.

In the drawings.

DETAILED DESCRIPTION

Hereinafter, the present disclosure will be described in detail with reference to the accompanying drawings.

The present disclosure provides a lighting apparatus including an organic light emitting device made of an organic material rather than a lighting apparatus including an inorganic light emitting device made of an inorganic material.

An organic light emitting device made of an organic light emitting material has a relatively good luminous efficiency in green and red colors as compared with an inorganic light emitting device. In addition, an organic light emitting device has a relatively larger width in blue, red and green emission peaks as compared with an inorganic light emitting device, and thus it has an advantage in that the color rendering property thereof is improved and the light of the light emitting apparatus is more similar to the sunlight.

According to the present disclosure, the lighting apparatus may be fabricated by a roll-to-roll process due to a roll fabrication apparatus, and the process may be continuously carried out, thereby allowing a rapid fabrication of the lighting apparatus. In particular, according to the present disclosure, an organic light emitting layer, which is a part of the organic light emitting device, and an electrode thereon may be formed without using an additional mask to avoid an expensive mask, thereby reducing fabrication cost.

Figure 1:
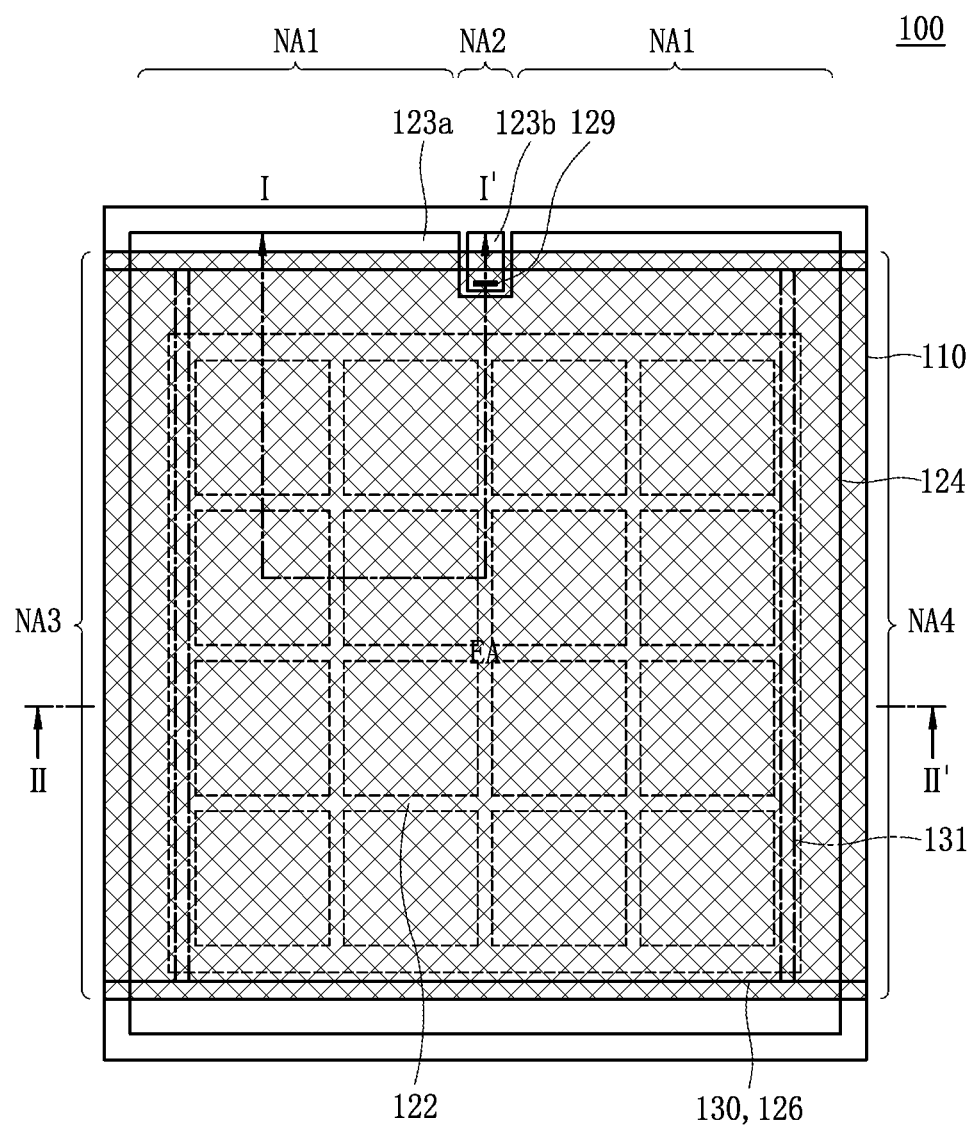
FIG. 1 is a plan view illustrating a lighting apparatus according to an aspect of the present disclosure.

FIG. 1 is a view illustrating the structure of a lighting apparatus using an organic light emitting diode according to the present disclosure. Here, the lighting apparatus according to the present disclosure is a flexible lighting apparatus capable of being bent.

As illustrated in FIG. 1, the lighting apparatus 100 according to the present disclosure is a surface emitting lighting apparatus, which includes a lighting portion (EA) that emits light to output the light to the outside, and outer portions (NA1, NA2) at the outside thereof. A first electrode 124 and a second electrode 126 are disposed over the entire surface of the first substrate 110, and an organic light emitting layer 130 is formed between the first electrode 124 and the second electrode 126 to form an organic light emitting device. According to the lighting apparatus 100 having such a structure, as a signal is applied to the first electrode 124 and the second electrode 126 of the organic light emitting device, the organic light emitting layer 130 emits light over the entire substrate 110.

A matrix-shaped auxiliary electrode 122 is disposed in a partial region of the lighting portion (EA) and the outer portions (NA1, NA2). The auxiliary electrode 122 is made of a metal having a high conductivity in such a manner that a uniform voltage can be applied to the first electrode 124 of the entire lighting portion (EA) to allow emission having a uniform luminance over the large-area lighting apparatus 100.

The organic light emitting layer 130 is formed of an organic light emitting material that outputs white light. For example, the organic light emitting layer 130 may include a blue organic light emitting layer, a red organic light emitting layer and a green organic light emitting layer or may have a tandem structure including a blue light emitting layer and a yellow-green light emitting layer. However, the organic light emitting layer 130 of the present disclosure is not limited to the above structure, but various structures may be applied thereto.

In addition, the present disclosure may include an electron injection layer and a hole injection layer for injecting electrons and holes respectively into the organic light emitting layer 130 of the present disclosure, an electron transport layer and a hole transport layer for transporting the injected electrons and holes respectively to the organic light emitting layer, and a charge generation layer that generates charges such as electrons and holes.

A first pad 123a, a second pad 123b and a contact portion 129 for electrically connecting to the second pad 123b to the second electrode 126 are disposed at an upper side of the outer portion (NA1, NA2) of the first substrate 110. The first pad 123a and the second pad 123b are connected to an external signal source to apply a voltage to the first electrode and the second electrode.

The first pad 123a is integrally formed with the first electrode 124, and the second pad 123b is formed of the same material as the first electrode 124 at the same layer, but the second pad 123b is separated from the first pad 123a and the first electrode 124 by a predetermined distance and electrically insulated therefrom.

The organic light emitting layer 130 is not disposed on the upper and lower outer portions (NA1, NA2) in which the first pad 123a and the second pad 123b are disposed, but the organic light emitting layer 130 is disposed on the left and right outer portions (NA3, NA4) in which the first and second pads 123a and 123b are not disposed. As a result, the organic light emitting layer 130 is not exposed on lateral end surfaces of the upper and lower sides of the lighting apparatus 100, whereas the organic light emitting layer 130 is exposed on lateral end surfaces of the left and right sides of the lighting apparatus 100.

Though will be described later, a plurality of the lighting apparatuses 100 are formed along a length direction of a film, and the film is cut subsequent to the completion of the process to separate the lighting apparatuses 10, respectively. A lateral end surface of the lighting apparatus 100 is a cut surface of the film. At this time, the organic light emitting layer 130 is deposited on the entire region along a length direction of the film, and thus the organic light emitting layer 130 is exposed to the outside through the cut surface, namely, a lateral end surface of the lighting apparatus 100, when the film is cut.

As described above, as the organic light emitting layer 130 is exposed through lateral end surfaces of the left and right sides of the lighting apparatus 100, moisture or air infiltrated into the organic light emitting layer 130 may be infiltrated into the lighting portion (EA) along the organic light emitting layer 130. In general, when a polymer constituting an organic light emitting material is combined with moisture, the light emitting property is rapidly deteriorated to reduce a luminescent efficiency of the organic light emitting layer 130. In particular, when a part of the organic light emitting layer 130 is exposed to the outside in the lighting apparatus, moisture is propagated into the entire lighting apparatus 100 along the organic light emitting layer 130 to reduce a light emitting efficiency of the lighting apparatus 100.

According to the present disclosure, in order to prevent moisture or air that has penetrated along the organic light emitting layer 130 exposed on lateral end surfaces of the left and right sides from being propagated to the lighting portion (EA), a part of the organic light emitting layer 130 is removed in the left and right outer portions (NA3, NA4) of the lighting apparatus 100 to form an open region 131 for disconnecting the organic light emitting layer 130, thereby preventing moisture from being propagated into the organic light emitting layer 130 of the lighting portion (EA) of the lighting apparatus 100 in which light is actually emitted.

Figure 2A:
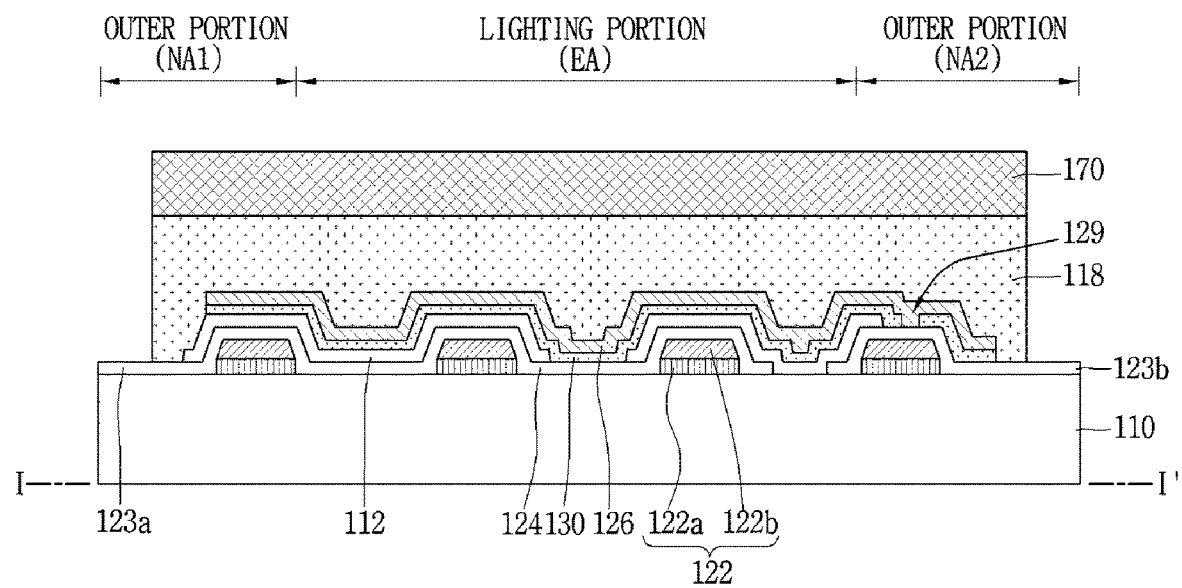
FIG. 2A is a cross-sectional view taken along line I-I' in FIG. 1.

FIG. 2A is a cross-sectional view taken along line I-I' in FIG. 1 and FIG. 2A is a cross-sectional view taken along line II-II' in FIG. 1, and the lighting apparatus 100 according to a first aspect of the present disclosure will be described in more detail with reference thereto. In the following description, the lighting apparatus of the present disclosure will be described as a flexible lighting apparatus having flexibility, but the present disclosure may be applicable not only to a flexible lighting apparatus of the present disclosure but also to a typical non-flexible lighting apparatus.

Figure 2B:
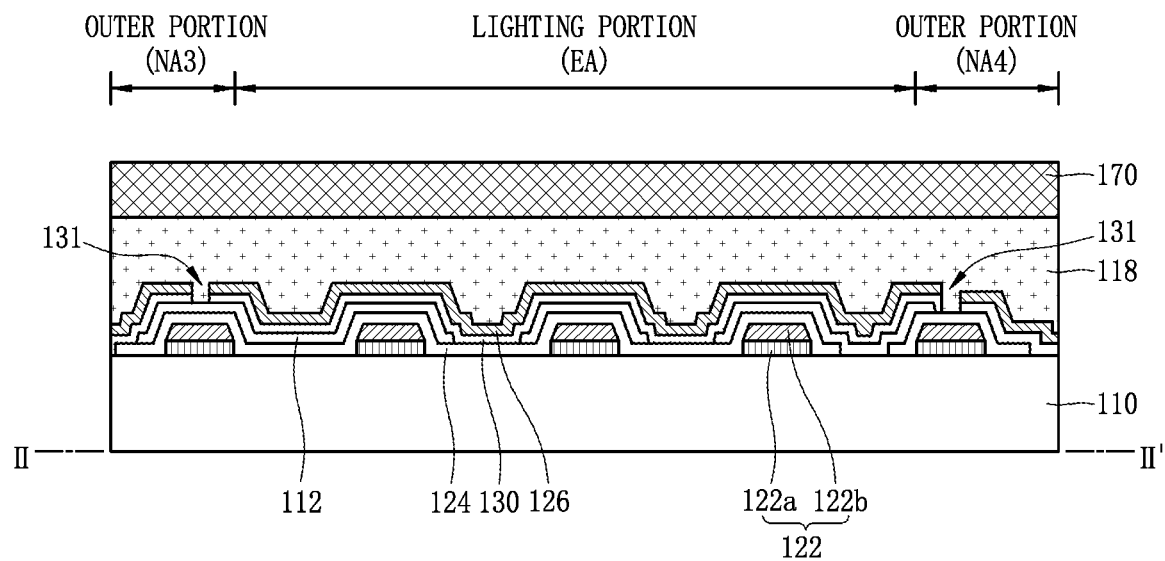
FIG. 2B is a cross-sectional view taken along line II-II' in FIG. 1.

As illustrated in FIGS. 2A and 2B, the lighting apparatus 100 of the present aspect may include a lighting portion (EA) that emits light, and outer portions (NA1, NA2, NA3, NA4) arranged along the outer circumference of the lighting portion (EA).

The first electrode 124 is disposed on the first substrate 110 made of a flexible transparent material such as plastic or a transparent material such as glass. Here, when a flexible material such as plastic is used for the substrate 110, it is possible to perform roll-to-roll processes using a roll, thereby allowing a rapid fabrication of the lighting apparatus 100. However, the present disclosure is not limited to a structure formed of a soft material such as plastic, but may also be formed of a non-flexible material such as glass. When the first substrate 110 is formed of glass as described above, it may be possible to fabricate the lighting apparatus 100 with a process of a general sheet method other than a process using a roll.

The first electrode 124 is disposed on the lighting portion (EA) and the outer portions (NA1, NA2, NA3, NA4) and formed of a transparent conductive material having a good conductivity and a high work function. For example, according to the present disclosure, the first electrode 124 may be formed of indium tin oxide (ITO), indium zinc oxide (IZO), a tin oxide based and a zinc oxide based transparent conductive material or the like, and a transparent conductive polymer may also be used for the first electrode 124.

Furthermore, the first pad 123a and the second pad 123b are disposed on the first outer portion (NA1) and the second outer portion (NA2) of the first substrate 110, respectively. The first pad 123a and the second pad 123b are formed of the same material by the same process as the first electrode 124. The first electrode 124 is extended from the first pad 123a and thus the first pad 123a is formed integrally with the first electrode 124, but the second pad 123b is spaced apart from the first electrode 124 by a predetermined distance.

The auxiliary electrode 122 is disposed on the lighting portion (EA) and the outer portions (NA1, NA2, NA3, NA4) of the first substrate 110, and electrically connected to the first electrode 124. The first electrode 124 has an advantage in that it is formed of a transparent conductive material to transmit light emitted therefrom, but also has a disadvantage in that an electrical resistance thereof is much higher than that of a metal. Accordingly, when the large-area lighting apparatus 100 is fabricated, the distribution of voltages applied to a wide lighting area becomes non-uniform due to a large resistance of the transparent conductive material, and such a non-uniform voltage distribution does not allow light emission having a uniform luminance on the large-area lighting apparatus 100.

The auxiliary electrode 122 is disposed in a matrix shape with a small width, a mesh shape, a hexagonal shape, an octagonal shape, a circular shape, or the like over the entire lighting portion (EA) to uniformly apply a voltage to the first electrode 124 of the entire lighting apparatus 100, thereby allowing light emission having a uniform luminance on the large-area lighting apparatus 100.

On the drawing, the auxiliary electrode 122 is disposed below the first electrode 124, but the auxiliary electrode 122 may also be disposed above the first electrode 124. The auxiliary electrode 122 is formed of a metal having a good conductivity such as Al, Au, Cu, Ti, W, and Mo or an alloy thereof. On the drawing, the auxiliary electrode 122 may be formed with a double layer structure,(122a 122b ), but the auxiliary electrode 122 may also be formed with a single layer.

A protective layer 112 is deposited on the lighting portion (EA) and the outer portions (NA1, NA2, NA3, NA4) of the first substrate 110. Here, the protective layer 112 disposed on the lighting portion (EA) is to cover the auxiliary electrode 122 and the first electrode 124 thereon, and the protective layer 112 is not disposed on a light emitting area from which light is actually emitted. Furthermore, the protective layer 112 of the lighting portion (EA) is formed to surround the auxiliary electrode 122 so as to reduce a stepped portion (or step coverage) due to the auxiliary electrode 122, and thus various layers to be formed thereafter will be stably formed without being disconnected.

The protective layer 112 is formed of an inorganic layer such as $SiO_x$ and $SiN_x$. However, the protective layer 112 may also be formed of an organic layer such as photoacryl and a plurality of layers having an inorganic layer and an organic layer.

The organic light emitting layer 130 and the second electrode 126 are disposed in a partial region of the lighting portion (EA) and the outer portions (NA1, NA2, NA3, NA4). Here, as illustrated in FIG. 2A, the organic light emitting layer 130 and the second electrode 126 are not formed in a partial region of the first and second outer portions (NA1, NA2) in which the first pad 123a and the second pad 123b are disposed, and thus the organic light emitting layer 130 and the second electrode 126 are not exposed to the outside through lateral end surfaces of two sides corresponding to this region of the lighting apparatus 100.

On the contrary, as illustrated in FIG. 2B, the organic light emitting layer 130 and the second electrode 126 are formed in the third and fourth outer portions (NA3, NA4) in which the first pad 123*a* and the second pad 123*b* are not disposed, and thus exposed to the outside through lateral end surfaces of two sides corresponding to this region. At this time, an open region 131 from which the organic light emitting layer 130 and the second electrode 126 are removed with a preset width is formed in parallel to two sides of the lighting apparatus 100 formed in a region spaced apart from the two sides of the lighting apparatus 100 by a predetermined distance in the third and fourth outer portions (NA3, NA4) to disconnect the organic light emitting layer 130. As a result, even when moisture or air infiltrates into an exposed cross section of the organic light emitting layer 130, the propagation of moisture and air may be stopped in the open region 131, thereby preventing moisture or air from being propagated to the organic light emitting layer 130 within the lighting portion (EA).

The organic light emitting layer 130 may be formed of a red light emitting layer, a blue light emitting layer, and a green light emitting layer or configured with a tandem structure including a blue light emitting layer and a yellow-green light emitting layer as a white organic light emitting layer. Furthermore, the organic light emitting layer 130 may include an electron injection layer and a hole injection layer for injecting electrons and holes respectively into the organic light emitting layer, an electron transport layer and a hole transport layer for transporting the injected electrons and holes respectively to the organic light emitting layer, and a charge generation layer that generates charges such as electrons and holes. The second electrode 126 may be formed of a metal such as Ca, Ba, Mg, Al and Ag.

The first electrode 124, the organic light emitting layer 130, and the second electrode 126 of the lighting portion (EA) form an organic light emitting device. When the first electrode 124 is an anode of an organic light emitting device and the second electrode 126 is a cathode thereof, and a voltage is applied to the first electrode 124 and the second electrode 126, electrons are injected from the second electrode 126 into the organic light emitting layer 130 and holes are injected from the first electrode 124 into the organic light emitting layer 130 to generate excitons within the organic light emitting layer 130, and as excitons decay, light corresponding to an energy difference between LUMO (Lowest Unoccupied Molecular Orbital) and HOMO (Highest Occupied Molecular Orbital) of the light emitting layer is generated and emitted in a downward direction (toward the substrate 110 on the drawing).

The protective layer 112 is disposed on the auxiliary electrode 122 of the lighting portion (EA), and the organic light emitting layer 130 on the auxiliary electrode 122 is not directly in contact with the first electrode 124, and thus the organic light emitting device is not formed on the auxiliary electrode 122. In other words, the organic light emitting device within the lighting portion (EA) is formed only within the auxiliary electrode 122 in a matrix shape, for example.

A portion of the organic light emitting layer 130 on the second pad 123*b* of the second outer portion (NA2) is removed to form the contact portion 129, and thus the second electrode 126 is electrically connected to the second pad 123*b* through the contact portion 129.

The contact portion 129 is an open region from which a partial region of the organic light emitting layer 130 is removed, namely, a contact hole. Here, the contact portion 129 may be formed in various shapes, and in particular, according to the present disclosure, the organic light emitting layer 130 may be removed by a laser to form the contact portion 129.

An adhesive 118 is coated on the first substrate 110 having the organic light emitting device and a second substrate 170 is disposed thereon, and the second substrate 170 is adhered by the adhesive 118 to seal the lighting apparatus 100. The adhesive 118 may be a photocurable adhesive or thermosetting adhesive. The second substrate 170 may be formed of various materials. The second substrate 170 is a substrate for preventing moisture or air from penetrating from the outside, and any material may be used as long as it can perform such a function. For example, the second substrate 170 may be formed of a polymer such as PET (polyethyleneterephtalate) or may be formed of a thin metal foil such as aluminum. In case of using a sheet fabrication apparatus other than a roll fabrication apparatus, a non-flexible material such as glass may be used.

As illustrated in FIG. 2A, the adhesive 118 applied to the first and second outer portions (NA1, NA2) in which the first pad 123*a* and the second pad 123*b* are disposed is also disposed on lateral end surfaces of the organic light emitting layer 130 and the second electrode 126 to seal the lateral end surfaces of the organic light emitting layer 130 and the second electrode 126. On the contrary, as illustrated in FIG. 2B, the adhesive 118 applied to the third and fourth outer portions (NA3, NA4) in which the first pad 123*a* and the second pad 123*b* are not disposed is extended and disposed up to a cross-section of the lighting apparatus 100 of the organic light emitting layer 130 and the second electrode 126, and the adhesive 118 is disposed only on the second electrode 126.

Furthermore, though not shown in the drawing, a protective layer formed of an organic layer and/or an inorganic layer and a sealant formed of an epoxy compound, an acrylate compound or an acrylic compound may be provided on the second electrode 126.

Furthermore, though not shown in the drawing, a flexible circuit film such as an FPC (flexible printed circuit) is attached to the first pad 123*a* and the second pad 123*b*, respectively, and the first pad 123*a* and the second pad 123*b* are respectively connected to an external signal source to apply a signal to the first electrode 124 and the second electrode 126.

As described above, according to the present disclosure, the organic light emitting layer 130 and the second electrode 126 are sequentially deposited in the same region, and the second electrode 126 and the organic light emitting layer 130 insulated by interposing the organic light emitting layer 130 therebetween are electrically connected to each other through the contact portions 129 formed on the organic light emitting layer 130. Furthermore, according to the present disclosure, an open region 131 for disconnecting the organic light emitting layer 130 is formed in a predetermined region at two sides exposed through the lateral end surface of the organic light emitting layer 130 to prevent moisture or air from being propagated into the lighting portion (EA) through the organic light emitting layer 130 exposed at lateral end surfaces of the lighting apparatus 100.

Hereinafter, a method of fabricating the lighting apparatus 100 according to the present disclosure will be described with reference to the accompanying drawings.

Figure 3:
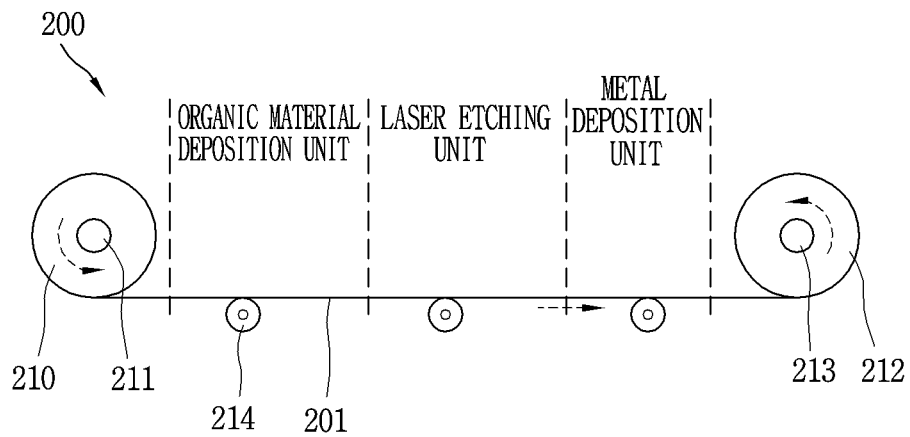
FIG. 3 is a view illustrating the concept of a roll fabrication apparatus for fabricating a lighting apparatus of the present disclosure.

FIG. 3 is a view schematically illustrating the structure of a roll fabrication apparatus 200 for fabricating a lighting apparatus according to the present disclosure. Here, the roll fabrication apparatus 200 illustrated in FIG. 3 is an apparatus of performing an organic material deposition process for forming an organic light emitting layer and a metal deposition process for forming a second electrode during the fabrication process of the lighting apparatus 100 illustrated in FIG. 2. However, the roll fabrication apparatus of the present disclosure may not be limited to only the process of forming the organic light emitting layer and the second electrode, but may also be applicable to the process of forming the first electrode.

In other words, the roll fabrication apparatus of the lighting apparatus 100 illustrated in FIG. 3 may form only a part (for example, the organic light emitting layer and the second electrode) of the configuration of the lighting apparatus 100 using a flexible film as the first substrate 110 as a continuous in-line by a roll-to-roll fabrication process, but also continuously form the entire configuration of the lighting apparatus 100 (including the first electrode and the protective layer, etc.) by a single roll fabrication apparatus.

As illustrated in FIG. 3, the roll fabrication apparatus 100 according to the present disclosure includes a first roll 210 configured to wind and supply a film 201 formed of a flexible material such as plastic, a second roll 212 configured to wind and collect the film 201 being transported from the first roll 210, and a plurality of guide rolls 214 disposed between the first roll 210 and the second roll 212 to guide the film 201 being transported.

The first roll 210 and the second roll 212 are coupled to a first drive shaft 211 and a second drive shaft 213 connected to external drive devices, respectively, and as the external drive devices are driven, a driving force is transmitted to the first roll 210 and the second roll 212 through a first drive shaft 211 and a second drive shaft 213 to rotate the first roll 210 and the second roll 212.

The film 201 is transported from the first roll 210 toward the second roll 212 as the first roll 210 and the second roll 212 rotate. An organic material deposition unit, a laser etching unit, and a metal deposition unit are provided on a transport path of the film 201. An organic light emitting material is deposited to form the organic light emitting layer 130 in the organic material deposition unit, and a metal is deposited to form the second electrode 126 in the metal deposition unit. The deposited organic material is removed by a laser to form the contact portion 129 connecting the second electrode 126 to the second pad 123b in the laser etching portion between the organic material deposition unit and the metal depositing unit.

Though not illustrated in the drawing, an additional laser etching unit may be provided at a rear end of the metal deposition unit. The laser etching unit at the rear end of the metal deposition unit etches the organic light emitting layer 130 and the second electrode 126 to form the open region 131 to prevent moisture and air from being infiltrated into the organic light emitting layer 130 from the outside. The laser etching unit for forming the open region 131 may be disposed separately from the organic material deposition part and the metal deposition part without being disposed in an in-line manner to carry out the process of transporting a film formed with the organic light emitting layer 130 and the second electrode 126 to another process and then etching a part of the organic light emitting layer 130 and the second electrode 126.

Figure 4:
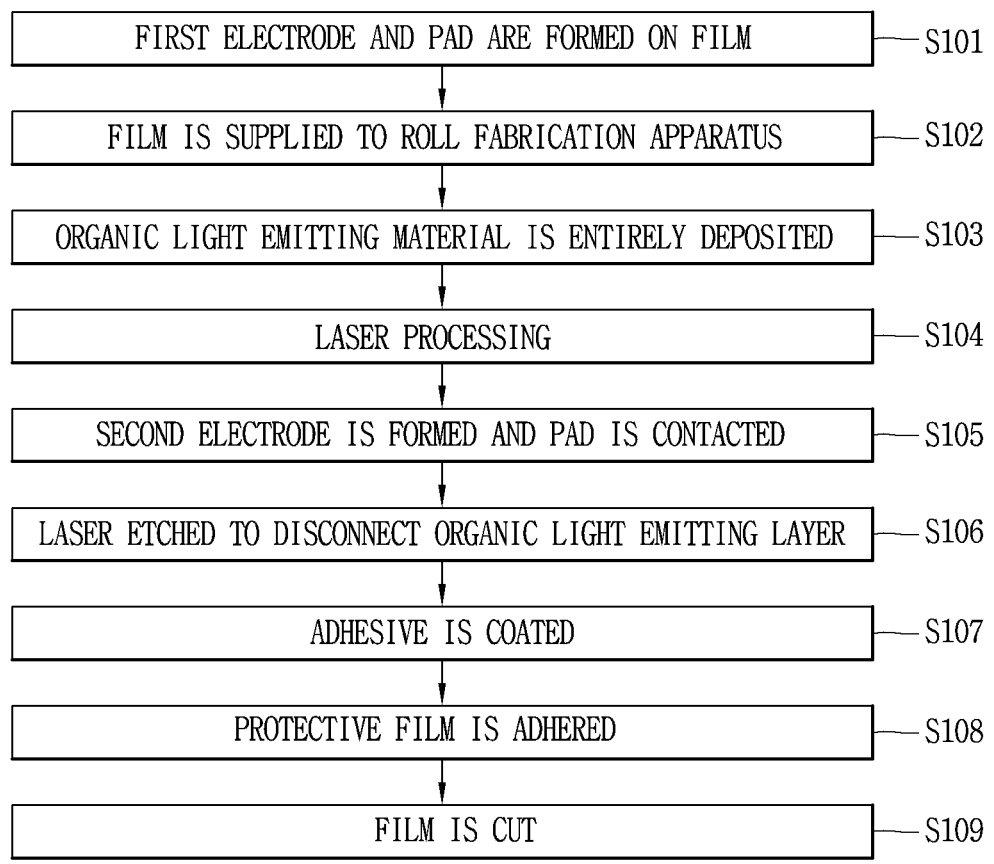
FIG. 4 is a flow chart schematically illustrating a fabrication method of a lighting apparatus according to the present disclosure.

FIG. 4 is a flow chart schematically illustrating a method of fabricating a lighting apparatus according to the present disclosure. Here, the illustrated method of fabricating a lighting device is a fabrication method in case where a plastic film having flexibility is used as the first substrate. However, such a fabrication method illustrates an example of a method of fabricating the lighting apparatus of the present disclosure, and the lighting apparatus of the present disclosure is not made only by the illustrated fabrication method.

As illustrated in FIG. 4, first, a tin oxide-based transparent conductor, a zinc oxide-based transparent conductor or a transparent conductive polymer is deposited and etched on a film such as a plastic to form the first electrode 124 and the pads 123a, 123b (S101). Here, the first electrode 124 and the pads 123a, 123b may be formed by a fabrication apparatus other than the roll fabrication apparatus illustrated in FIG. 3, but also formed by the roll fabrication apparatus 200 in line with the organic material deposition unit and the metal deposition unit.

Here, the film is a flexible film such as plastic, and a plurality of lighting apparatuses 100 are formed on the film by a plurality of processes, and the film is cut and divided into individual lighting apparatuses 100.

Figure 5:
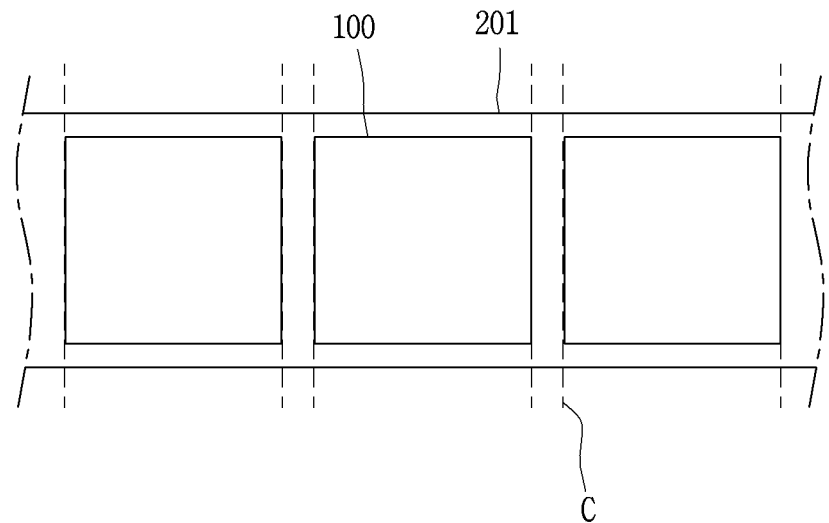
FIG. 5 is a view briefly illustrating a film on which a lighting apparatus of the present disclosure is fabricated.

FIG. 5 is a view illustrating a film on which a process is carried out by a roll fabrication apparatus having a structure illustrated in FIG. 3.

As illustrated in FIG. 5, a plurality of lighting apparatuses 100 is arranged in a line along a length direction of the film 201. All the processes illustrated in FIG. 4 are carried out on the film 201, and subsequent to the completion of all the processes, the film 201 is cut and divided into a plurality of lighting apparatuses 100.

Here, a cutting line (C) is formed in a width direction of the film 201. The cutting line (C) is formed along the sides of the lighting apparatuses 100 arranged in a length direction of the film 201, and the lighting apparatuses 100 are divided into each lighting apparatus along the cutting line (C) at the completion of the lighting apparatuses 100.

Referring to FIG. 4 again, the film 201 on which the first electrode 124 and the pads 123a, 123b are formed is supplied to the roll fabrication apparatus 200 illustrated in FIG. 3 (S102), and the mask 202 is disposed on the entire surface of the film 201 (S103). At this time, the deposition of the organic luminescent material is carried out in a state that two side edge regions of the film 201 illustrated in FIG. 5 are blocked, and the organic light emitting material is not deposited on the first outer portion (NA1) and the second outer portion (NA2) formed with the pads 123a, 123b to expose the pads 123a, 123b to the outside, and it will be described in more detail.

Figure 6A:
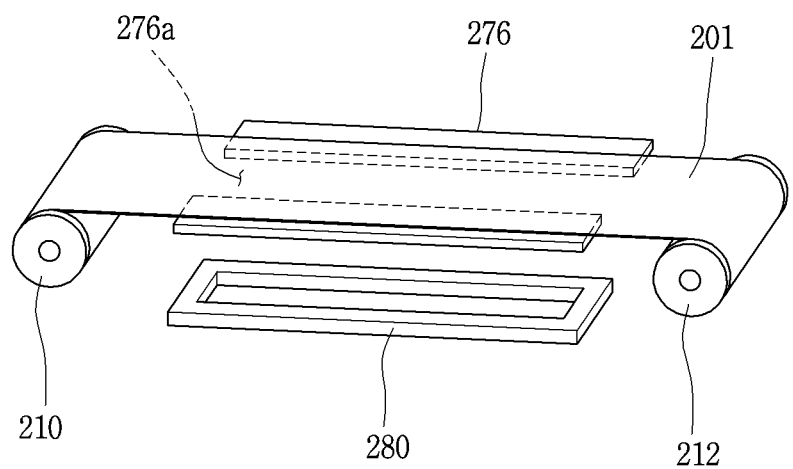
FIGS. 6A and 6B are views illustrating a fabrication apparatus used to fabricate a lighting apparatus according to the present disclosure.

FIG. 6A is a view illustrating a specific structure of the organic material depositing portion of the roll fabrication apparatus illustrated in FIG. 3. Though not illustrated in the drawing, the structure of the metal deposition unit is also substantially the same.

As illustrated in FIG. 6A, the organic material deposition unit of the roll fabrication apparatus according to the present disclosure includes a deposition member 280 configured to deposit an organic light emitting material to form a layer on the film 201 being transported between the first roll 210 for supplying the film 201 and the second roll 212 for collecting the film 201, and a shielding member 276 disposed between the film 201 and the deposition member 280.

In general, for the fabrication process of the lighting apparatus 100, an organic light emitting material is deposited only on a part of the substrate using a mask formed of metal to form the organic light emitting layer 130. Therefore, when the lighting apparatus 100 is fabricated using the roll fabrication apparatus 200 as illustrated in FIG. 3, a deposition process should be carried out in a state that an additional mask is disposed on an entire surface of the film 201 being transported, thereby complicating the fabrication apparatus as well as disallowing the rapid process.

Furthermore, an additional mask may be provided on the supply roll and the collection roll, and then the process may be carried out while transporting the mask in synchronization with the film 201. However, in this case, since additional mask supply roll and mask collection roll are required, and thus there is a problem of increasing facility cost as well as increasing a volume of the facility. Furthermore, when the film 201 and the mask are not precisely synchronized, there is a problem that the organic light emitting layer 130 to be formed becomes defective.

However, in the roll fabrication apparatus according to the present disclosure, the shielding member 276 is provided between the film 201 and the deposition member 280 of the organic material deposition unit to cover an edge region of the film 310 to block deposition of an organic material in this region during the deposition process. Since the first pad 123a and the second pad 123b are disposed in the edge region of the film 201, when the organic material is deposited in this region, the first electrode 123 and the second electrode 123b are covered by the organic light emitting layer 130 not to allow the external terminal to make electrical contact with the first pad 123a and the second pad 123b, thereby disallowing the lighting apparatus 100 to operate. Of course, when a deposition process is carried out in a state that an additional mask is disposed on an entire surface of the film 201 being transported, the organic material is deposited only in a part of a region where the lighting apparatus is to be formed but the organic light emitting layer 130 is not deposited in a region formed with the first pad 123a and the second pad 123b is formed, and therefore, there is no problem in applying a voltage.

However, as described above, when a mask is used, facility cost increases due to complicated facilities, thereby disallowing the rapid process as well as increasing the possibility of failure of the formed organic light emitting layer 130.

According to the present disclosure, the shielding member 276 is provided without using such a mask not to deposit the organic light emitting layer 130 in a region where the first pad 123a and the second pad 123b are disposed. In other words, when the organic material is deposited, the shielding member 276 covers only the edge region of the film 201 formed with the first pad 123a and the second pad 123b not to deposit the organic material on the first pad 123a and the second pad 123b.

The shielding member 276 as a device having an opening portion 276a having a predetermined width formed of a material such as metal or the like is fixedly provided on the deposition member 280. When the film 201 is continuously deposited by the deposition member 280 while being transported between the first roll 210 and the second roll 212, a region formed with the lighting apparatus of the film 201 is exposed to the deposition member 280 through the opening portion 276a of the deposition member 276, and an organic material vaporized in the deposition member 280 is deposited in a region exposed through the opening portion 276a.

Figure 6B:
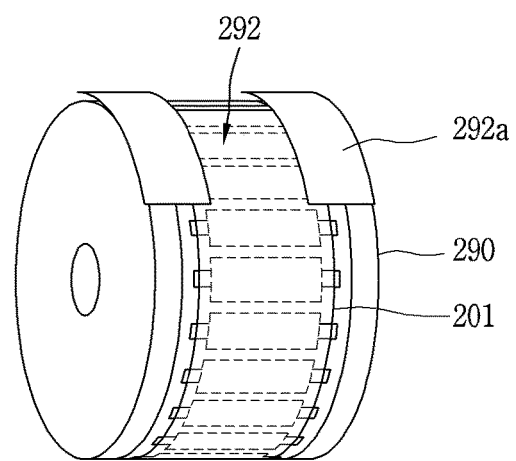

In addition, the organic material deposition unit of the roll fabrication apparatus of the present disclosure may be configured as illustrated in FIG. 6B.

As illustrated in FIG. 6B, the film 201 on which the lighting apparatus 100 is formed may be deposited on a deposition drum 290 while being wound around the deposition drum 290. A shielding member 292 is provided along a circumferential surface of the deposition drum 290 to form an opening portion 292a and a region formed with the lighting apparatus of the film 201 is exposed to the outside through the opening portion 292a. A deposition member (not shown) may be disposed on a surface opposite to the opening portion 292a, and an organic material may be deposited on the exposed region of the film 201 through the opening portion 292a.

Referring back to FIG. 4, a partial region of the organic light emitting layer 130 is processed (etched) by a laser to form the contact portion 129 in the organic light emitting portion 130 (S104).

Then, a metal is deposited by the metal deposition unit having the structure illustrated in FIGS. 6A and 6B in a state that an edge region of the film 201 is blocked by the shielding member to form the second electrode 126 (S105). At this time, the second electrode 126 is also formed on the contact portion 128 formed on the organic light emitting portion 130, and thus the second electrode 126 is electrically connected to the second pad 123b through the contact portion 130.

On the other hand, the organic light emitting layer 130 and the second electrode 126 are formed by depositing an organic light emitting material and a metal using the shielding member 276. Therefore, the second electrode 126 is deposited only in a region corresponding to the open area 276a of the shielding member 276 but not deposited in a region blocked by the shielding member 276, and thus the second electrode 126 is not formed on the second pads 123a, 123b disposed on the second outer portion (NA2) corresponding to both side edge regions of the film 201, and as a result, the second electrode 126 is electrically connected to the second pad 123b.

However, the contact portion 129 in which a partial region of the organic light emitting layer 130 is etched is formed on the organic light emitting layer 130, and the second electrode 126 is also formed within the contact portion 129, and thus the second electrode 126 is electrically connected to the second pad 123b through the contact portion 129.

Subsequent to forming the second electrode 126, the second electrode 126 and the organic light emitting layer 130 are simultaneously etched by a laser to remove the second electrode 126 and the organic light emitting layer 130 to form an open region so as to disconnect the organic light emitting layer 130 along two side edge regions of the lighting apparatus 100 (S106), and then the adhesive 118 is coated on the film 201 to attach the protective film 170, thereby forming a plurality of lighting apparatuses 100 on the film 201 (S107, S108). At this time, the protective film may be formed of various materials. For example, the protective film may be formed of a polymer such as PET or a thin metal foil. In case of using a sheet fabrication apparatus other than a roll fabrication apparatus, a non-flexible material such as glass may be used.

Then, the lighting apparatus 100 completed by cutting the film 201 is separated to complete each lighting apparatus 100. Here, as illustrated in FIG. 5, the cutting of the film 201 is carried out along a cutting line (C) formed along a width direction of the film 201. In other words, a region spaced apart from the cutting line of the film 201 by a predetermined distance will be the third and fourth outer portions (NA3, NA4).

As described above, according to the present disclosure, the organic light emitting layer 130 and the second electrode 126 are formed in a region excluding a partial region of the first and second outer portions (NA1, NA2) without using a mask. In this case, since the organic light emitting layer 130 and the second electrode 126 are formed in the same region, the organic light emitting layer 130 is disposed between the second electrode 126 and the second pad 123b. Therefore, when the organic light emitting layer 130 and the second electrode 126 are formed without using a mask as in the present disclosure, the second electrode 126 and the second pad 123b are formed by interposing the organic light emitting layer 130 therebetween, and thus, the second electrode 126 and the second pad 123b are electrically insulated by the organic light emitting layer 130.

Of course, in order to electrically connect the second electrode 126 to the second pad 123b, an area of the organic light emitting layer 130 may be formed to be smaller than that of the second electrode 126 using a plurality of masks, and the second electrode 126 may be extended to the outer region of the organic light emitting layer 130 and disposed on an upper surface of the second pad 123b, thereby allowing the second electrode 126 in contact with the second pad 123b. However, in this case, a mask to be used may be added to complicate the structure of facilities, thereby increasing fabrication cost.

According to the present disclosure, the organic light emitting layer 130 and the second electrode 126 are formed without using a mask, and a part of the organic light emitting layer 130 is removed to form the contact portion 129 so as to electrically connect the second electrode 126 to the second pad 123b, and the second electrode 126 and the second pad 123b are electrically connected to each other through the contact portion 129.

Furthermore, according to the present disclosure, since the organic light emitting layer 130 and the second electrode 126 are formed in the entire region of the lighting portion (EA) and the third and fourth outer portions (NA3, NA4) without using a mask, the organic light emitting layer 130 is exposed to the outside through a lateral end surface thereof, and moisture or air propagates into the lighting portion (EA) along the exposed organic light emitting layer 130 by the exposure of the organic light emitting layer 130. According to the present disclosure, the organic light emitting layer 130 in a region spaced apart from the exposed lateral end surface by a predetermined distance is etched by a laser to form the open region 131 substantially parallel to the lateral end surface.

Since the open region 130 is disconnected from the organic light emitting layer 130, it may be possible to prevent moisture and air infiltrated through the exposed organic light emitting layer 130 from being propagated into the lighting portion (EA).

In other words, according to the present disclosure, it may be possible to fabricate a non-defective lighting apparatus without using an additional mask, thereby allowing a continuous in-line roll-to-roll process.

Hereinafter, a fabrication method of a lighting apparatus according to the present disclosure will be described in detail.

FIGS. 7A through 7D are cross-sectional views illustrating a practical fabrication method of the lighting apparatus 100 according to the present disclosure, and FIGS. 8A through 8D are plan views illustrating a practical fabrication method of the lighting apparatus 100 according to the present disclosure. Here, the fabrication process of the lighting apparatus 100 may be carried out on a plastic film on which a continuous process is carried out by a roll fabrication apparatus, but the present disclosure may not be limited thereto, but may be carried out on a glass mother substrate having a large area. In particular, According to the present disclosure, the lighting apparatus 100 is fabricated using a single mask. Furthermore, for the following process, a fabrication process of a plurality of lighting apparatuses is carried out in the film unit or mother substrate unit, but for the following description, it will be described in one lighting apparatus unit.

Figure 7A:
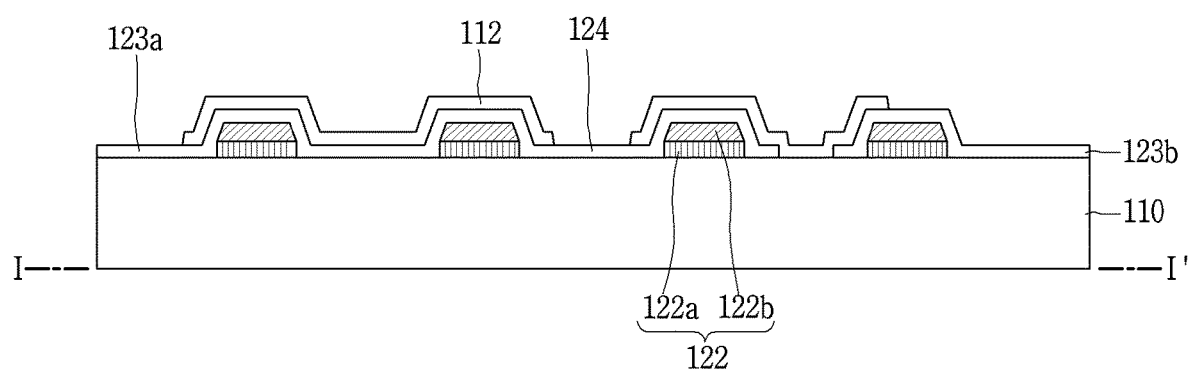
FIGS. 7A through 7D are cross-sectional views specifically illustrating a fabrication method of a lighting apparatus according to the present disclosure.
Figure 8A:
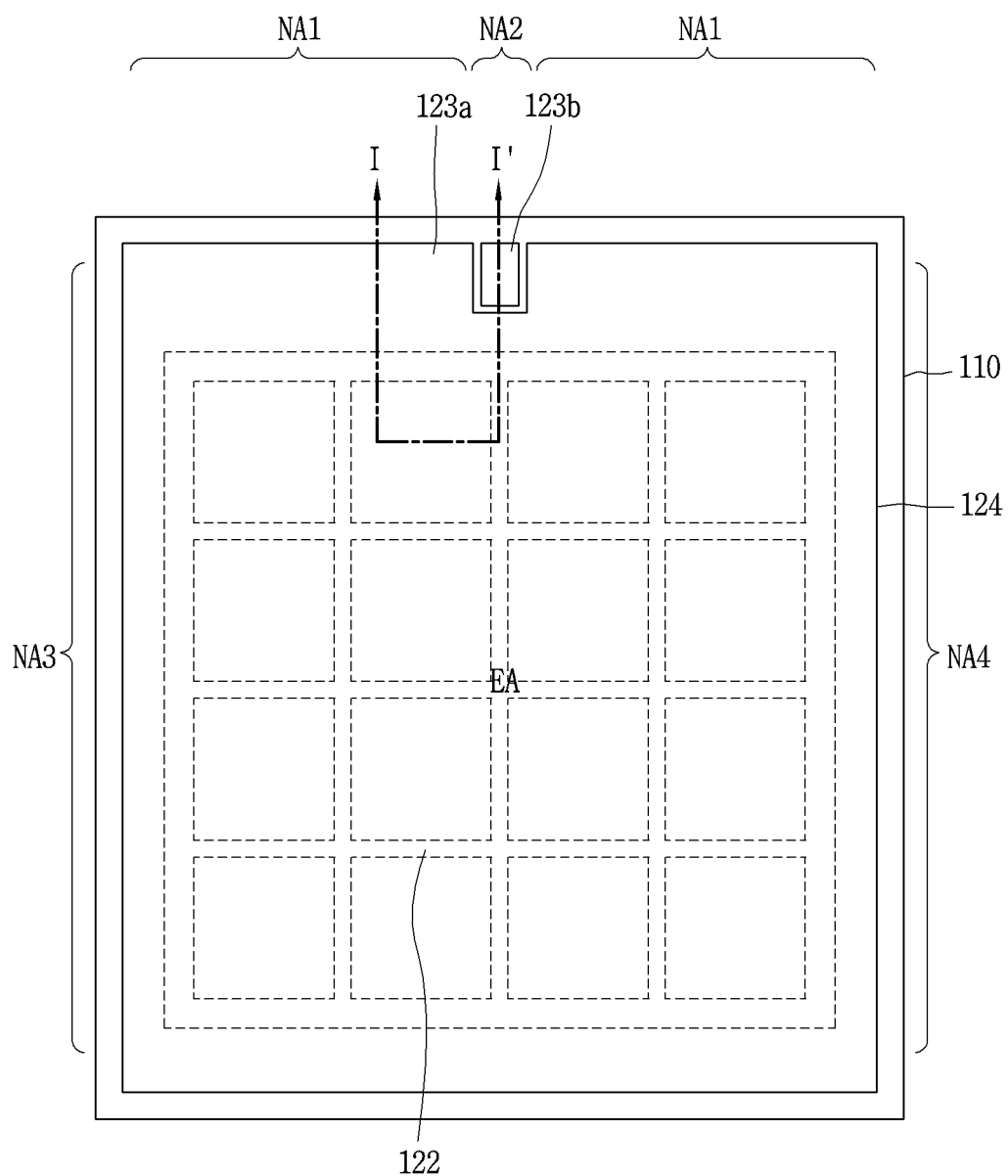
FIGS. 8A through 8D are plan views specifically illustrating a fabrication method of a lighting apparatus according to the present disclosure.

First, as illustrated in FIGS. 7A and 8A, a metal such as Al, Au, Cu, Ti, W, and Mo or an alloy thereof is deposited and etched on a first substrate 110 formed of a flexible material such as plastic and glass or the like to include a lighting portion (EA) and outer portions (NA1, NA2) so as to form an auxiliary electrode 122 configured with a single layer or a plurality of layers on the lighting portion (EA) and the outer portions (NA1, NA2). Here, the auxiliary electrode 122 is disposed in a matrix shape in a horizontal direction and a vertical direction in a band shape set on an entire region of the lighting portion (EA) and a partial region of the outer portions (NA1, NA2), but the auxiliary electrode 122 may be disposed in a matrix shape, a mesh shape, a hexagonal shape, an octagonal shape or a circular shape.

Then, a transparent conductive material such as ITO and IZO is deposited and etched over the entire surface of the first substrate 110 to form a first electrode 124 disposed on the auxiliary electrode 122 of the lighting portion (EA) and the first outer portion (NA1), and form a first pad 123a and a second pad 123b on the second outer portion (NA2) and on the first outer portion (NA1) and the second outer portion (NA2), respectively. Subsequently, an insulating material such as $SiN_x$ and $SiO_x$ is deposited and etched on the lighting portion (EA) and the first and second outer portions (NA1, NA2) to form a protective layer 112.

Here, the auxiliary electrode 122, the first electrode 124, and the first and second pads 123a, 123b may be formed by a continuous photo process on a roll fabrication apparatus or may be formed by a typical sheet-type photo process.

Figure 7B:
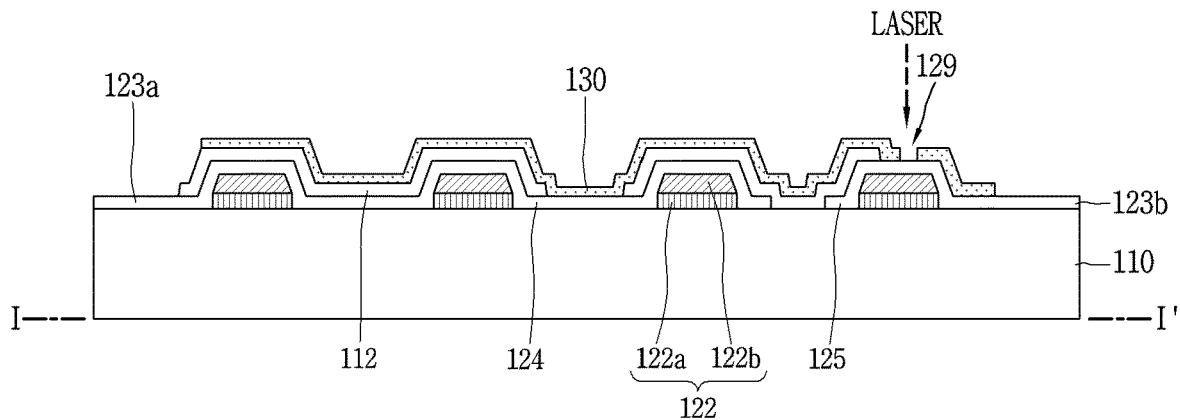
Figure 8B:
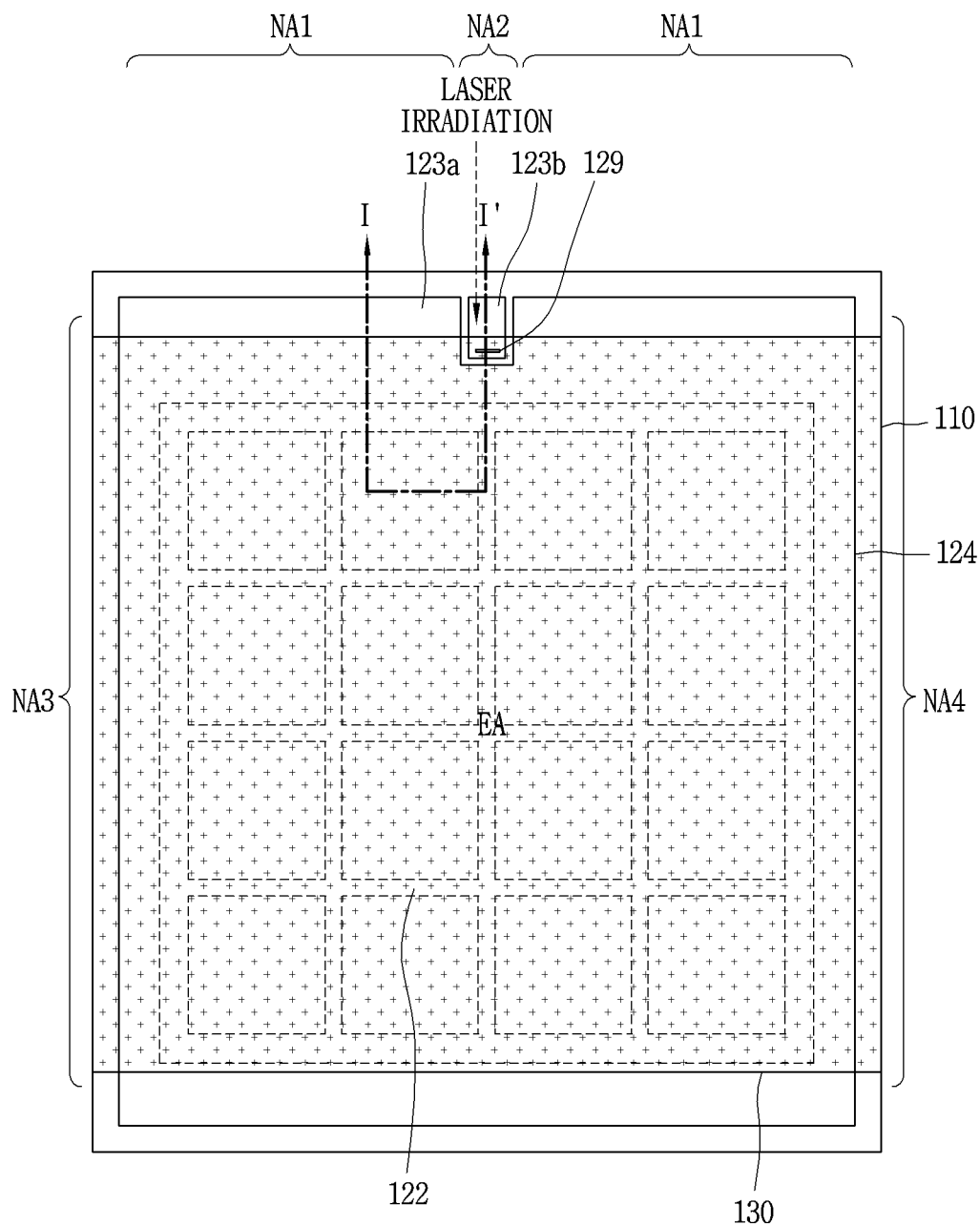

Then, as illustrated in FIGS. 7B and 8B, an organic light emitting material is deposited on a partial region of the lighting portion (EA) and the first and second outer portions (NA1, NA2) of the first substrate 110 to form an organic light emitting layer 130. Here, the formation of the organic light emitting layer 130 may be carried out by a roll fabrication apparatus having the structure illustrated in FIG. 3. In other words, in a state that both edge regions of the film 201 are blocked by the shielding member 276, an organic light emitting material may be deposited to form the organic light emitting layer 130. Here, both edge regions of the first substrate 110, namely, two side edge regions of the substrate 110, are blocked, and thus the organic light emitting layer 130 is not formed in the two side edge regions of the first substrate 110, and the first pad 123a and the second pad 123b are not hidden by the organic light emitting layer 130 but exposed to the outside.

Furthermore, the formation of the organic light emitting layer 130 may be formed by disposing a mask on a mother substrate formed with a plurality of lighting apparatuses, and then depositing an organic light emitting material.

Then, a laser is irradiated on the organic light emitting layer 130 of the second outer portion (NA2) to etch the organic light emitting layer 130 in the relevant region so as to form a contact portion 129 on the second light emitting layer 130 in which the second pad 123b is exposed to the outside. Here, the contact portion 129 may be formed in a thin band shape having a predetermined length on the second outer portion (NA2) at an upper portion of the lighting apparatus 100, but the contact portion 129 is not limited to a specific shape or area, and may be configured in various shapes and areas. For example, the contact portion 129 may be configured in various shapes and areas such as a circular shape and a polygonal shape.

Figure 7C:
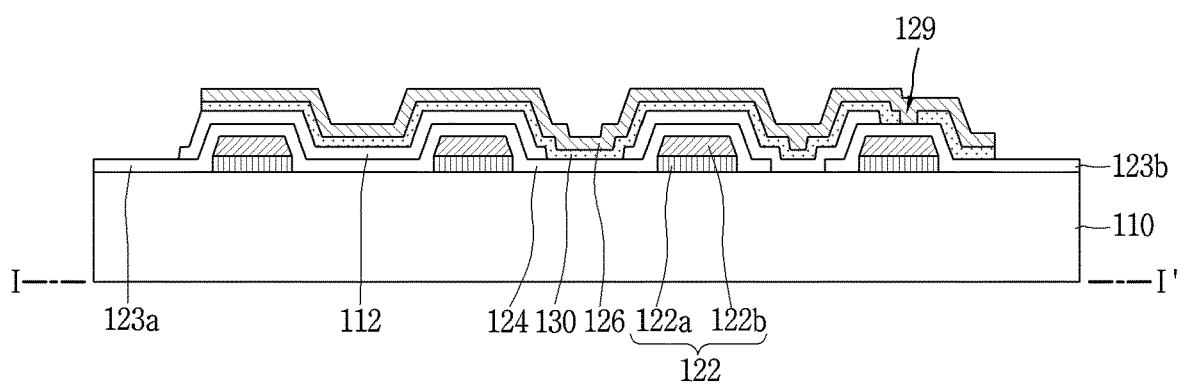
Figure 8C:
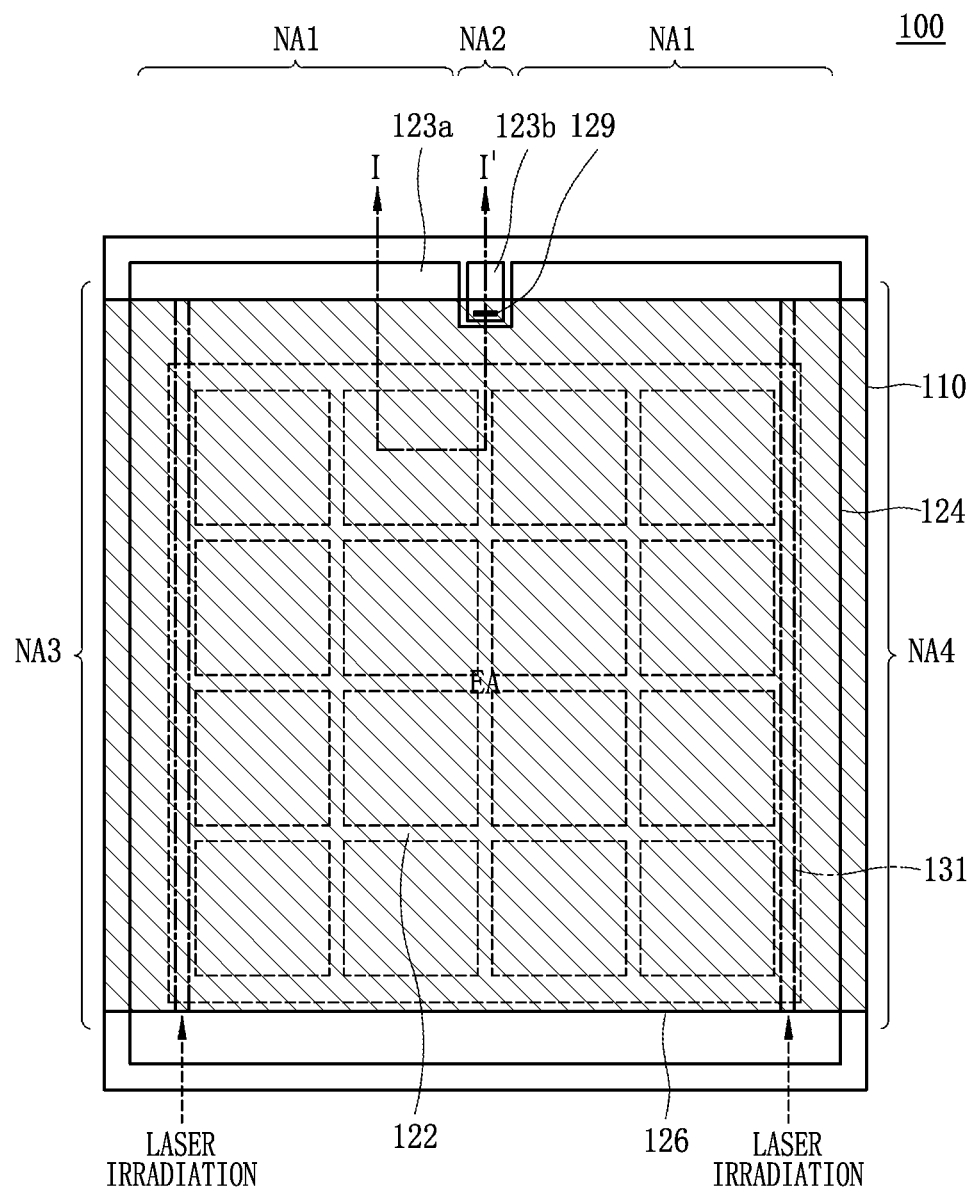

Subsequently, as illustrated in FIGS. 7C and 8C, a metal such as Ca, Ba, Mg, Al and Ag is deposited on the organic light emitting layer 130 to form a second electrode 126. In this case, the second electrode 126 may also be deposited by a roll fabrication apparatus having the shielding member 276 as illustrated in FIGS. 6A and 6B. Accordingly, the second electrode 126 is formed only in a region formed with the organic light emitting layer 130, and thus the metal is not deposited on two side edge regions of the substrate 110. Therefore, the second electrode 126 is not formed on the first pad 123a and the second pad 123b of the first and second outer portions (NA1, NA2) and the first pad 123a and the second pad 123b are exposed to the outside. In other words, the organic light emitting layer 130 and the second electrode 126 are not disposed in a partial region of the first and second outer portions (NA1, NA2), and thus the organic light emitting layer 130 and the second electrode 126 are not also disposed on the first pad 123a and the second pad 123b and the first pad 123a and the second pad 123b are exposed to the outside and electrically connected to an external signal source.

Furthermore, the second electrode 126 is also formed inside the contact portion 129 formed on the organic light emitting layer 130, and thus the second electrode 126 is electrically connected to the second pad 123b through the contact portion 129.

Since the organic light emitting layer 130 and the second electrode 126 are deposited on the roll fabrication apparatus having the shielding portion 276, the organic light emitting layer 130 and the second electrode 126 are sequentially deposition in the same region as illustrated in the drawing. Accordingly, the organic light emitting layer 130 is disposed between the second electrode 126 and the second pad 123b and thus the second electrode 126 and the second pad 123b are electrically insulated from each other. When a voltage applied thereto through the second pad 123b from the outside, the voltage is not applied to the second electrode 126, thereby not allowing the lighting apparatus 100 to operate.

Therefore, in order to drive the lighting apparatus 100, the second electrode 126 and the second pad 123b should be electrically connected to each other to apply a voltage to the second electrode 126. According to the present disclosure, a part of the organic light emitting layer 130 is etched by a laser to form the contact portion 129, and the second electrode 126 and the second pad 123b are connected through the contact portion 129.

On the other hand, the organic light emitting layer 130 and the second electrode 126 are formed using two masks such as a mask for forming the organic light emitting layer 130 and a mask for forming the second electrode 126 and the second pad 123b to connect the second electrode 126 to the second pad 123b. In other words, the organic light emitting layer 130 and the second electrode 126 are formed using two masks having open regions of different sizes such that the second electrode 126 is formed not only on a upper portion of the organic light emitting layer 130 but also on an upper portion of the second pad 123b, thereby connecting the second electrode 126 to the second pad 123b. However, in this case, an additional mask should be used, thereby increasing fabrication cost increases and complicating fabrication process.

Accordingly, according to the present disclosure, in order to connect the organic light emitting layer 130 and the second electrode 126 while at the same time forming the organic light emitting layer 130 and the second electrode 126 without using a mask, a part of the light emitting layer 130 is etched by a laser to form the contact portion 129.

Subsequently, the second electrode 126 and the organic light emitting layer 130 are etched by a laser to form the open region 131 on the second electrode 126 and the organic light emitting layer 130. As illustrated in FIG. 8C, the open region 131 is formed in an inner region of two sides where the pads 123a, 123b of the lighting apparatus 100 are not formed, namely, in a region spaced apart from both the cutting lines (C) of the lighting apparatus 100 formed on the film 201 in FIG. 5 to an inside of the lighting apparatus 100 by a predetermined distance to disconnect the organic light emitting layer 130 exposed to a lateral end surface of the lighting apparatus 100 by cutting the film 201, thereby preventing moisture or air from being propagated from the outside to the organic light emitting layer 130 of the lighting portion (EA).

Figure 7D:
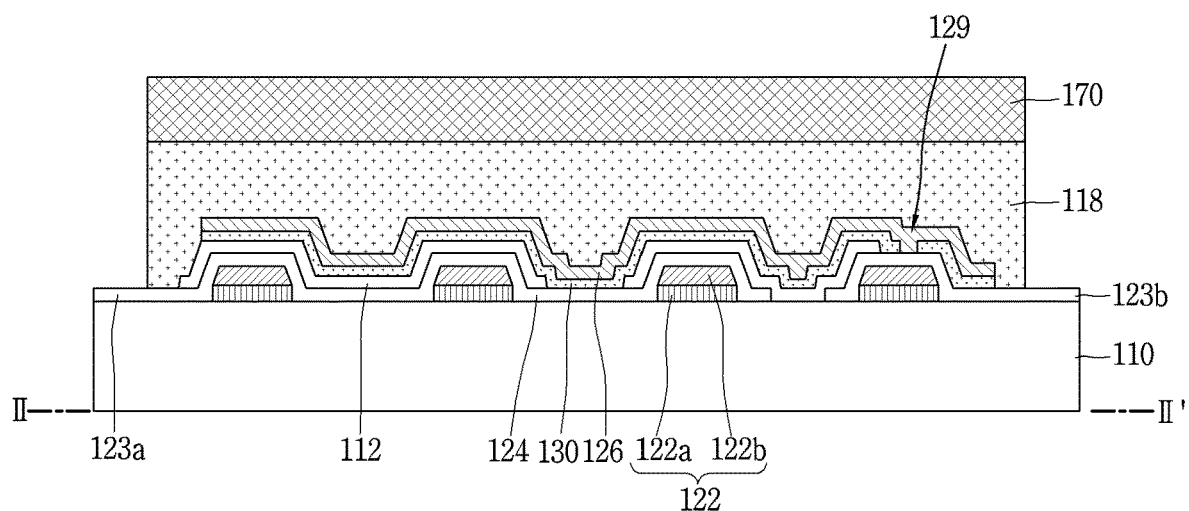
Figure 8D:
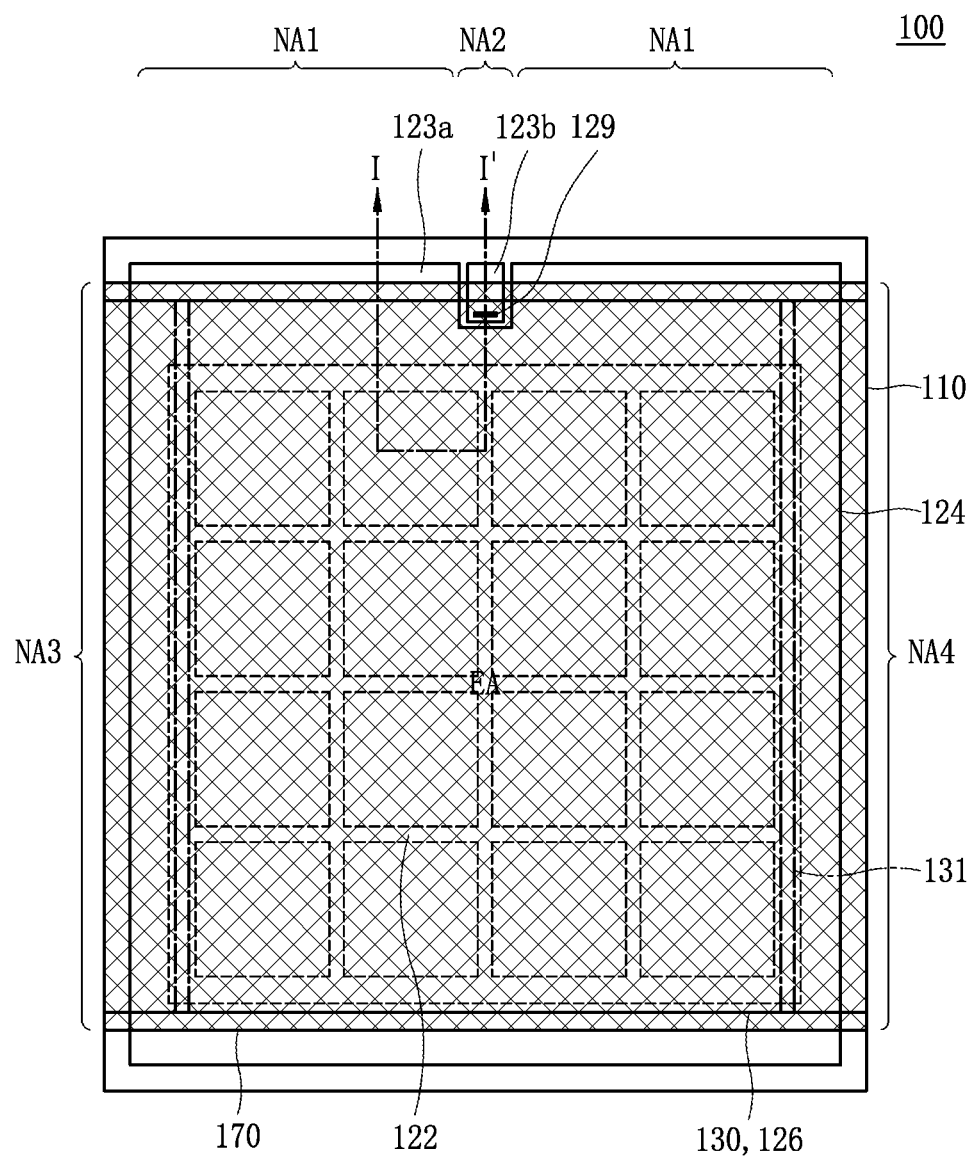

Then, as illustrated in FIGS. 7D and 8D, an adhesive 118 formed of a photocurable adhesive material or thermosetting adhesive material is coated on the first substrate 110, and a second substrate 170 is placed thereon, and then the second substrate 170 is adhered thereto by curing the adhesive 118, and then the first substrate 110 and the second substrate 170 adhered to each other are cut to separate a completed lighting apparatus 100, thereby completing each lighting apparatus 100.

For the second substrate 170, a polymer film such as PET, a thin metal foil such as aluminum, glass, or the like may be used.

Here, as illustrated in FIG. 5, the cutting of the substrates 110, 170 is carried out along a cutting line (C) formed along a width direction of the substrates 110, 170. In other words, the cutting of the substrates 110, 170 is carried out along a vertical direction of the sides of the substrates 110, 170 formed with the pads 123a, 123b, and thus the organic light emitting layer 130 and the second electrode 126 are exposed to the outside to a lateral end surface of the lighting apparatus 100 as illustrated in FIG. 2B.

At this time, the cutting of the substrates 110, 170 may be carried out with various methods. For example, the film 201 may be cut by a laser such as an Nd-YAG laser or a $CO_2$ laser or the substrates 110, 170 may be cut using a mechanical cutting tool.

Figure 9:
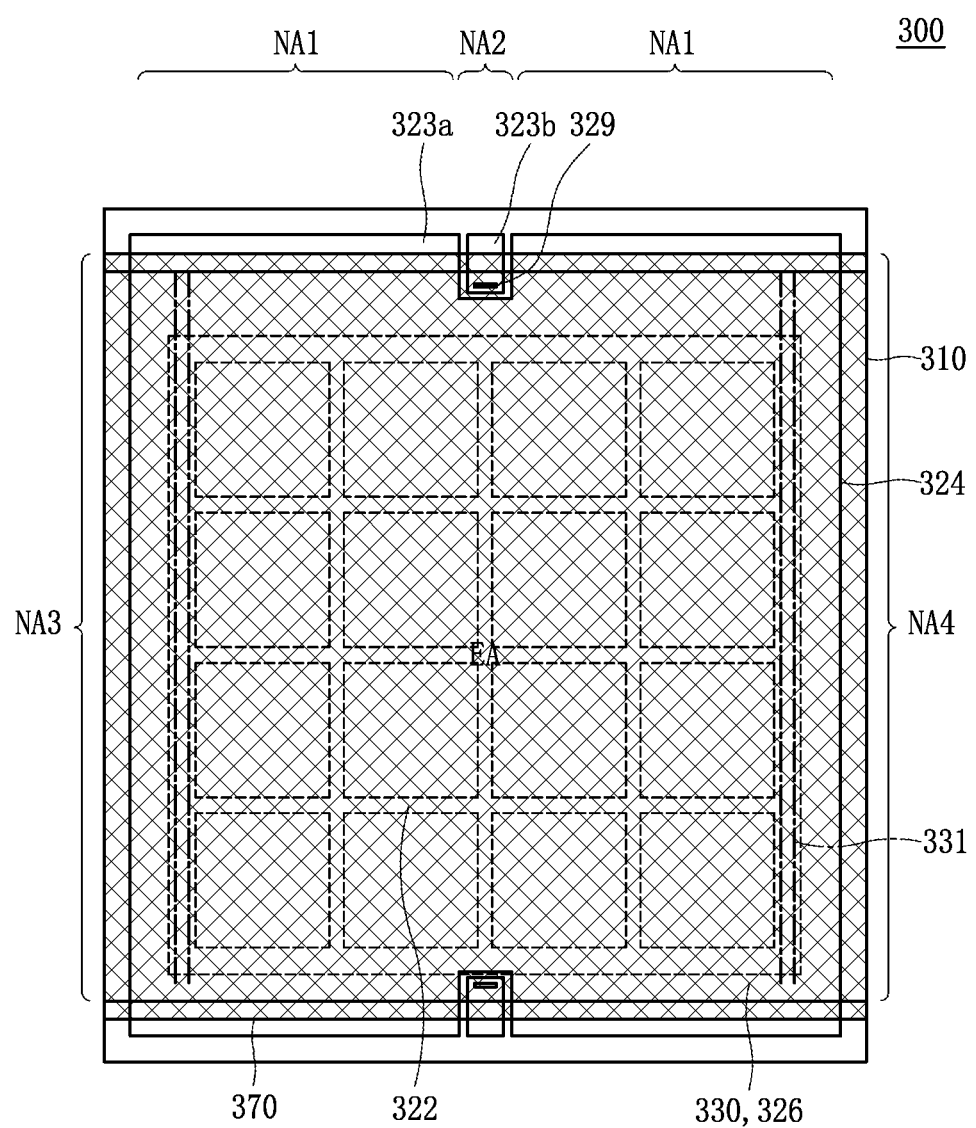
FIG. 9 is a plan view illustrating a lighting apparatus according to another aspect of the present disclosure.

FIG. 9 is a view illustrating a lighting apparatus 300 according to another aspect of the present disclosure.

As illustrated in FIG. 9, the lighting apparatus 300 of another aspect is configured with a first substrate 310 including a lighting portion (EA) for emitting light to output the light to the outside, and outer portions (NA1, NA2) at an outside thereof. The first substrate 310 is formed of plastic or glass having flexibility, and a first electrode 324 and a second electrode 326 are disposed on the first substrate 310, and an organic light emitting layer 330 is disposed between the first electrode 324 and the second electrode 326. In addition, a matrix-shaped auxiliary electrode 322 is disposed in a partial region of the lighting portion (EA) and the outer portions (NA1, NA2).

A first outer portion (NA1) and a second outer portion (NA2) are disposed on an upper side and a lower side of the first substrate 310, respectively, and a first pad 323a is provided on the first outer portion (NA1) and a second pad 323b is disposed on the second outer portion (NA2).

The organic light emitting layer 330 and the second electrode 326 are formed using the same mask, and thus the organic light emitting layer 330 and the second electrode 326 are formed in the same area on the first substrate 310.

Accordingly, the organic light emitting layer 330 is disposed between the second pad 323b formed integrally with the first electrode 324 and the second electrode 326, and thus the second electrode 326 is electrically disconnected from the second pad 323b by the organic light emitting layer 330. A contact portion 329 from which a part of the organic light emitting layer 330 of the second outer portion (NA2) is removed by a laser or the like is formed, and the second electrode 326 is electrically connected to the second pad 323b through the contact portion 329, and a signal is applied to the second electrode 326 through the second pad 323b.

In particular, according to the lighting apparatus of this aspect, the first pad 323a and the second pad 323b are formed on an upper and a lower edge regions of the first substrate 310, respectively, and a signal is applied from an upper side and a lower side of the lighting apparatus 300, and thus the signal may be quickly applied to the entire lighting apparatus 300 as compared with the lighting apparatus of the first aspect illustrated in FIG. 1 in which only one first pad 323a and second pad 323b is formed, thereby allowing a quick drive of the lighting apparatus 300.

In particular, it can prevent quality deterioration due to a signal delay during the fabrication of the lighting apparatus 300 having a large area.

Figure 10:
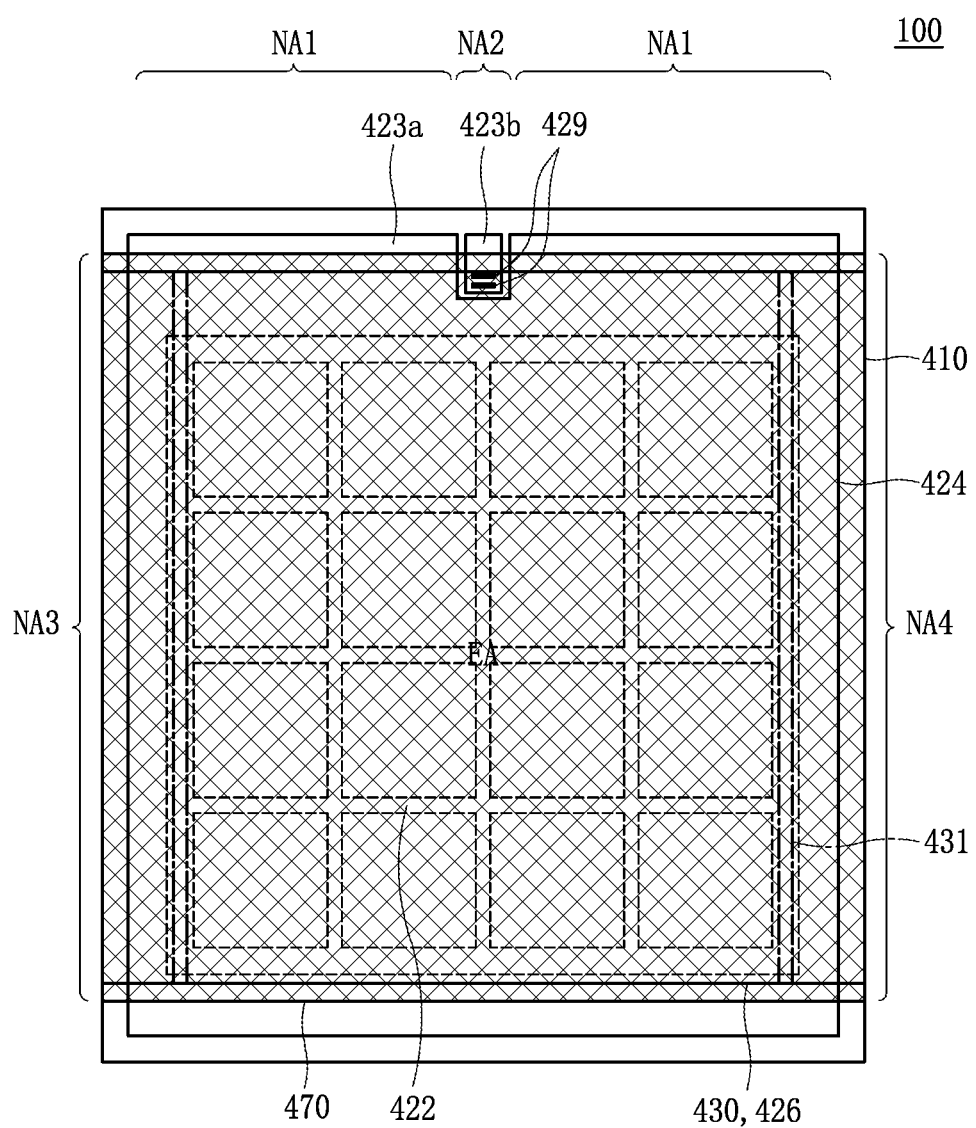
FIG. 10 is a plan view illustrating a lighting apparatus according to a third aspect of the present disclosure.

FIG. 10 is a plan view illustrating the structure of a lighting apparatus 400 according to yet another aspect of the present disclosure.

As illustrated in FIG. 10, according to the lighting apparatus 400 of this structure, a first outer portion (NA1) and a second outer portion (NA2) is disposed on an upper side of the first substrate 400. Furthermore, two contact portions 429 are formed on the second pad 423b disposed on the second outer portion (NA2), and thus the second electrode 426 and the second pad 423b are connected to each other through the two contact portions 429. As described above, this aspect may be formed with two contact portions 429, thereby preventing a signal delay due to a contact resistance as compared with the structure in which one contact portion is formed.

On the drawing, two contact portions 429 may be formed, but three or more contact portions 429 may also be formed. Furthermore, as illustrated in FIG. 9, two or more second pads 423b may be formed on the first substrate 410, and a plurality of contact portions 429 may be formed on each of the second pads 423b.

As described above, according to the present disclosure, an organic light emitting material may be deposited on a substrate without using a mask to form a lighting apparatus. In particular, according to the present disclosure, the organic light emitting layer and the second electrode may not be formed on a pad during the deposition of the organic light emitting layer and the second electrode by a roll fabrication apparatus having the shielding member, thereby forming a lighting apparatus. Furthermore, according to the present disclosure, a part of the organic light emitting layer 130 may be etched with a laser to electrically connect the second electrode 126 to the second pad 123b, thereby not requiring the use of an additional mask.

For a lateral end surface of a side of the lighting apparatus disposed and cut in a length direction of the film, the organic light emitting layer 130 may be exposed to the outside, but an open region in parallel to the exposed side may be formed in a region spaced apart from the exposed side by a predetermined distance to disconnect the organic light emitting layer 130, preventing air or moisture from being propagated to the organic light emitting layer within the lighting portion.

Various modified examples of the present disclosure or structures that can be easily contrived based on the present disclosure should be included in the scope of the present disclosure. Accordingly, the right scope of the present disclosure should not be determined by the foregoing detailed description, but should be determined by the appended claims.

What is claimed is:

1. A lighting apparatus comprising:
a first substrate comprising a lighting portion, a first outer portion at an outer edge of the lighting portion, a second outer portion surrounded by the first outer portion, third and fourth outer portions facing each other and disposed perpendicular to the first and second outer portions;
an organic light emitting device comprising a first electrode, an organic light emitting layer, and a second electrode arranged at the lighting portion;
first and second pads respectively disposed at the first and second outer portions and respectively connected to the first electrode and the second electrode where a voltage to be applied;
an auxiliary electrode in a mesh type disposed under the first electrode and electrically connected to the first electrode;
a protective layer covering the auxiliary electrode and a portion of the first electrode where the first electrode overlaps the auxiliary electrode and the first outer portion of the first substrate; and
wherein the organic light emitting layer and the second electrode are distanced from lateral end surfaces of the first and second outer portions and are disposed at the lateral end surfaces of the third and fourth outer portions and are exposed outside the organic light emitting device,
wherein each of the second electrode and the organic light emitting layer at the third and fourth outer regions has an opening region spaced apart from the lighting portion to disconnect and the organic light emitting layer within the third and fourth outer portions, and
wherein the second pad is electrically connected to the second electrode through a contact portion disposed on an outermost part of the auxiliary electrode, which is disposed on the second outer potion.

2. The lighting apparatus of claim 1, wherein the second pad is formed at a same layer as the first pad.

3. The lighting apparatus of claim 2, wherein the organic light emitting layer and the second electrode have the same area, and the organic light emitting layer is disposed between the second electrode and the second pad.

4. The lighting apparatus of claim 3, wherein the contact portion is formed by removing a portion of the organic light emitting layer by a laser where the organic light emitting layer overlaps the second electrode.

5. The lighting apparatus of claim 4, wherein the contact portion has a band shape.

6. The lighting apparatus of claim 4, wherein the contact portion has a hole shape.

7. The lighting apparatus of claim 1, wherein the first and the second pads are disposed on the first substrate and are exposed at the first outer portion.

8. The lighting apparatus of claim 1, wherein the first substrate is formed of a flexible film.

9. The lighting apparatus of claim 1, wherein the first substrate is formed of glass.

10. The lighting apparatus of claim 1, further comprising:
a second substrate attached to the first substrate by an adhesive.

11. The lighting apparatus of claim 10, wherein the second substrate is formed of one of a polymer film, a metal foil and glass.

12. The lighting apparatus of claim 1, wherein the auxiliary electrode is disposed in one of a matrix shape, a mesh shape, an octagonal shape, a hexagonal shape, and a circular shape within the lighting portion.

13. The lighting apparatus of claim 1, wherein each of the opening regions is disposed on an outermost part of the auxiliary electrode at the third and fourth outer regions.

14. The lighting apparatus of claim 1, wherein the organic light emitting layer is disposed between the second electrode and the second pad.

\* \* \* \* \*